United States Patent

Penn

[11] 3,980,817
[45] Sept. 14, 1976

[54] CHARGE COUPLED DEVICE MULTIPLEXING SYSTEM FOR IMAGE SENSORS

[75] Inventor: Thomas Clifton Penn, Richardson, Tex.

[73] Assignee: Texas Instruments Incorporated, Dallas, Tex.

[22] Filed: Sept. 30, 1974

[21] Appl. No.: 510,263

[52] U.S. Cl. .................................. 178/6; 178/7.6; 178/7.1; 178/7.2; 178/7.7
[51] Int. Cl.² .......................................... H04N 5/30
[58] Field of Search ................ 178/6, 7.6, 7.2, 7.1, 178/7.7

[56] References Cited
UNITED STATES PATENTS
3,822,362    7/1974    Weckler.............................. 178/7.1

Primary Examiner—Robert L. Griffin
Assistant Examiner—Edward L. Coles
Attorney, Agent, or Firm—Harold Levine; James T. Comfort; Richard L. Donaldson

[57] ABSTRACT

The specification discloses a multiplexing system for an image detection array having laterally staggered first and second rows of image detectors which generate electrical signals representative of sensed images. First and second charge coupled device shift registers are connected to receive the electrical signals through channel inlets spaced along the lengths of the registers. Circuitry is operable during a first clock period for parallel loading electrical signals from the first row of detectors into a first set of alternate ones of the channel inlets of the first shift register. Circuitry is operable during a second clock period for parallel loading electrical signals from the second row of detectors into a second set of alternate ones of the channel inlets of the first shift register for storage between electrical signals from the first row of detectors. Circuitry is also operable during the second clock period for parallel loading electrical signals from the first row of detectors into a first set of alternate ones of the channel inlets of the second shift register. Circuitry is operable during a third clock period for parallel loading electrical signals from the second row of detectors into a second set of alternate ones of the channel inlets of the second shift register. Shift circuitry is provided to selectively serially clock the stored electrical signals from the output of the first and second registers to provide a composite display representative of the sensed images.

12 Claims, 6 Drawing Figures

CHARGE COUPLED DEVICE MULTIPLEXING SYSTEM FOR IMAGE SENSORS

This invention relates to detection array systems, and more particularly relates to a multiplexing system including charge coupled devices for use with an image detection array.

Various types of image detection systems have heretofore been developed with include image detection arrays made up of a plurality of individual image sensing devices. The electrical signals generated from the image sensing devices are then scanned and displayed on a video screen. As an example, forward looking infrared sensing devices have heretofore been developed utilizing an array of photosensors which are utilized to scan infrared images.

When such image detection arrays are not limited by size, the individual image sensors may be symmetrically oriented to provide contiguous inline arrays, thereby decreasing the complexity of the display circuitry. However, in many applications, it is necessary to substantially reduce the size of the image detection array. One technique for accomplishing this reduction of size is to laterally stagger rows of the image sensors in the array relative to one another. Such staggered arrays require operation upon the sensor output signals in order to simulate a contiguous inline array.

A need has thus arisen for circuitry for multiplexing the output of staggered image detection arrays, such circuitry preferably not requiring fast analog-to-digital conversion. It would also be advantageous for such circuitry to have its timing controlled in a digital manner, as well as being solid state and economical to fabricate. The present invention thus provides a multiplexing system for an image detection array which provides the above-enumerated and other advantages in construction and operation with the utilization of charge coupled device shift registers.

In accordance with the present invention, a multiplexing system is provided for a detection array having staggered rows of sensors. Circuitry is connected to parallel load alternate ones of a series of storage cells with first output signals from one of the sensor rows. Circuitry is provided to parallel load others of the storage cells with second output signals from another of the sensor rows, such that the first and second signals are alternately stored within the cells. Circuitry then serially clocks the first and second signals out from the storage cells to provide a multiplexed series of signals.

In accordance with another aspect of the invention, a multiplexing system for an image detection array includes first and second rows of image detectors for generating electrical signals representative of sensed images. The second row of image detectors is laterally staggered relative to the first row and is spaced away from the first row. First and second charge coupled device shift registers each have a plurality of channel inlets spaced along the length thereof. Circuitry is operable during a first clock period to parallel load electrical signals from the first row of detectors into a first set of alternate ones of the channel inlets of the first shift register for storage within alternate stages of the first shift register. Circuitry is operable during a second clock period for parallel loading electrical signals from the second row of detectors into a second set of alternate ones of the channel inlets of the first shift register for storage in the first shift register between electrical signals from the first row of detectors. Circuitry is operable during the second clock period for parallel loading electrical signals from the first row of detectors into a first set of alternate ones of the channel inlets of the second shift register for storage within alternate stages of the second shift register. Circuitry is operable during a third clock period for parallel loading electrical signal from the second row of detectors into a second set of alternate ones of the channel inlets of the second shift register for storage in the second shift register between electrical signals from the first row of detectors. Circuitry selectively serially clocks the stored electrical signals from the outputs of the first and second shift registers for providing a composite display representative of the sensed images.

In accordance with another aspect of the invention, a method of multiplexing outputs from an image detection array includes sequentially generating electrical output signals from first and second rows of physically staggered image sensors. Electrical signals are parallel loaded from the first row into a first set of alternate channel inlets of a first charge coupled device shift register. Electrical signals are parallel loaded from the second row into a second set of alternate channel inlets of the first register while parallel loading electrical signals from the first row into a first set of alternate channel inlets of a second charge coupled device shift register. Electrical signals are parallel loaded from the second row into a second set of alternate channel inlets of the second register. The stored electrical signals are then serially clocked from the outputs of the first and second registers. A composite display of the electrical signals is then displayed.

For a more complete understanding of the present invention and for further objects and advantages thereof, reference is now made to the following description taken in conjunction with the accompanying drawings, in which.

Figure 1:
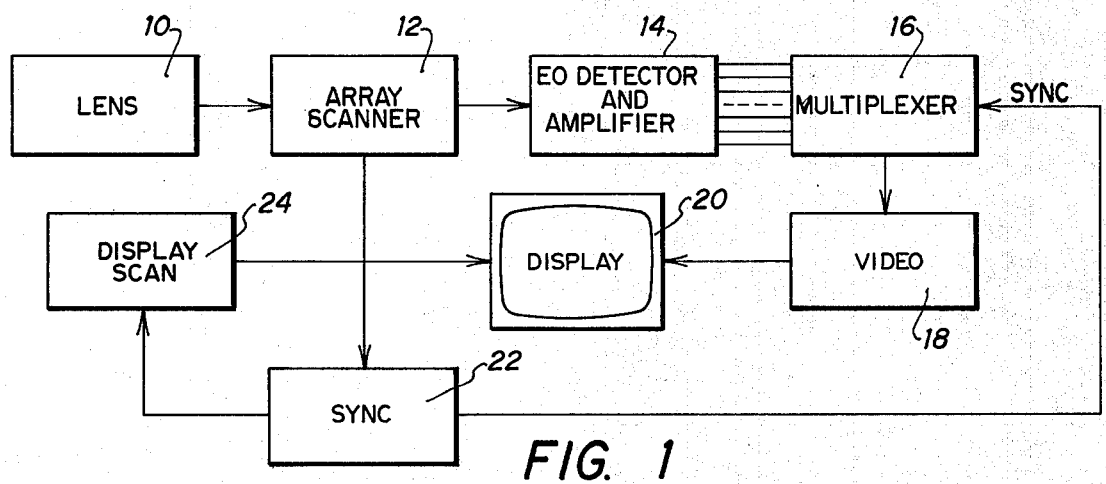
FIG. 1 is a block diagram of an image detection system utilizing the multiplexor of the present invention.

Referring to FIG. 1, an image detection system is illustrated which includes a lens system or detector array 10 which comprises an array of individual image sensors. In this embodiment, the array comprises a plurality of rows of image sensors, the rows being spaced apart and laterally staggered relative to one another to reduce the required size of the array. Parallel electrical signals from the lens 10 representative of the sensed images are applied through an array scanner 12 to an electron optics detector and amplifier 14. The amplified image signals are applied to a multiplexer 16 which multiplexes the input signals into series signals to simulate output signals from a contiguous inline symmetrical array. These multiplexed signals are applied through a video scan circuit 18 for display on a suitable display screen 20. A synchronizer 22 generates synchronizing signals in synchronism with operation of the array scanner 12 to operate a display scan circuit 24 for controlling the scanning operation of the display 20. The sync generator 22 also generates a sync signal for operation of the multiplexor 16.

It would be desirable to utilize charge coupled devices (CCDs) to perform the multiplexing function of multiplexer 16. CCD accumulated charge is proportional to the intensity of the lens image, which in turn causes the intensity of the display 20 to vary proportionally to portray an imaged likeness of the objects in view of the lens 10. If the CCDs are not driven analog, it would require very complex analog-to-digital conversion, complex shift register stages and ditial-to-analog conversion to drive the display. However, with the use of the present invention, such complex circuitry is not required.

Figure 2:
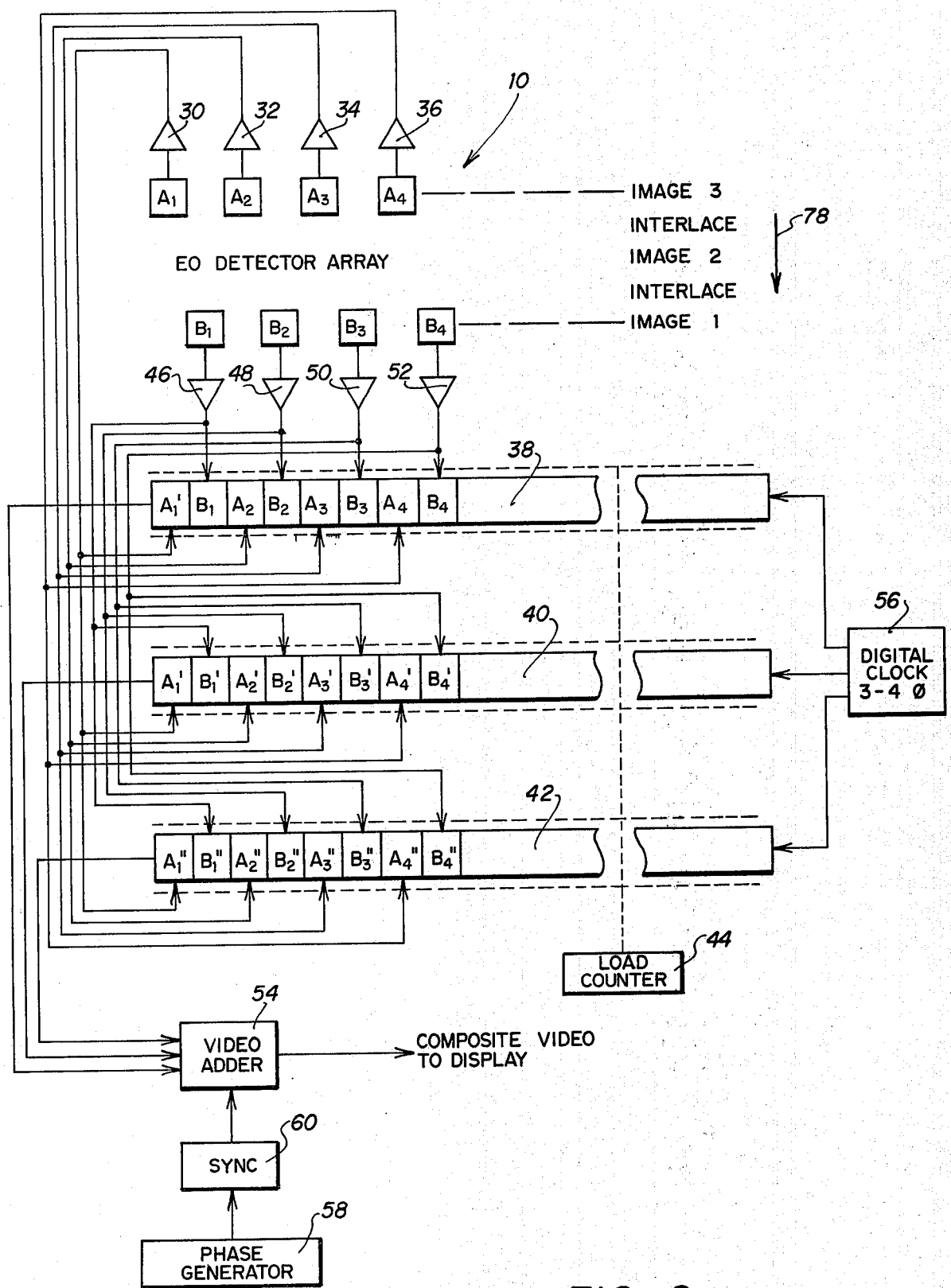
FIG. 2 is a block diagram of an embodiment of the present multiplexing system.

FIG. 2 illustrates a block diagram of a multiplexor according to the present invention for two rows of laterally staggered image sensors. It will of course be understood that the present invention could be utilized for more than two rows of sensors, and with different interlace configurations. Referring to FIG. 2, an A row of image sensors comprises a plurality of sensors $A_1$–$A_4$. A B row of sensors include image sensors $B_1$–$B_4$. As previously noted, the illustrated sensors may comprise any one of a variety of types of image sensors, such as infrared photosensors. As shown in FIG. 2, the A and B rows of sensors are spaced apart from one another and are laterally staggered relative to one another to provide reduction in array size. Thus, within the proper multiplexing, the resulting displayed images would not truly represent the desired display.

The outputs of sensors $A_1$–$A_4$ are transmitted through amplifiers 30, 32, 34 and 36 for input into spaced apart storage cells of three charge coupled device (CCD) shift registers 38, 40 and 42. Specifically, electrical signals generated from the A sensors may be stored in every other storage cell of each of the shift registers 38, 40 and 42. The outputs from the A sensor are parallel loaded into any one of the shift registers 38, 40 and 42 by operation of a load counter 44. As will be described in greater detail with respect to FIG. 3, load counter 44 generates loading signals which controls the sequential loading of the outputs from the sensors into alternate ones of the storage cells of the shift registers 38–42.

In a similar manner, the electrical signals generated from the B sensors $B_1$–$B_4$ are applied through amplifiers 46, 48, 50 and 52. The outputs of amplifiers 46–52 may be selectively parallel loaded into a second set of alternate storage cells of the shift registers 38–42 in the manner illustrated. Thus, the output signals from the A sensor row are stored in alternate cells in registers 38–42 which are spaced apart by storage cells containing information from the B sensor row. The parallel loading of the output signals from sensors $B_1$–$B_4$ is controlled by the load counter 44 in the manner to be subsequently described.

The outputs of the registers 38–42 are applied to a video adder 54. A digital clock 56, which may be three or four phase as desired, controls the clocking operation of the registers 38–42. Under the control of clock 56, the contents of the storage registers 38–42 may be serially clocked outwardly to the video adder 54 to provide a composite video signal which is applied to the display 20 in the manner shown in FIG. 1. A phase generator 58 operates a sync circuit 60 for control of the adder 54.

Figure 3:
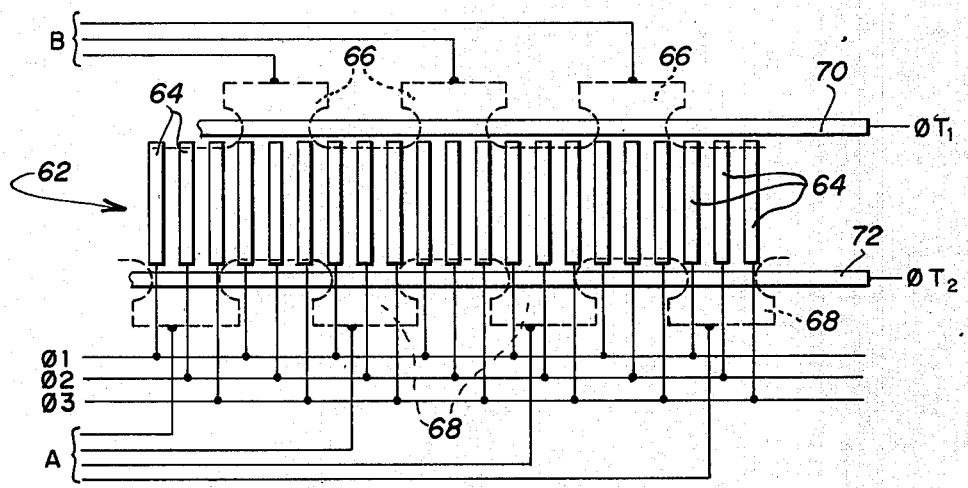
FIG. 3 is a somewhat diagrammatic top view of a portion of a typical parallel-to-serial charge coupled device shift register for use in the present invention.

FIG. 3 illustrates a somewhat diagrammatic top view of a typical charge coupled device (CCD) storage register for use with the registers 38–42 shown in FIG. 2. The register shown in FIG. 3 may be of any desired length and may be utilized for a single one of the shift registers 38–42. As is shown, the CCD shift register includes a channel 62 formed in either an N-type or P-type silicon substrate. An MOS-type silicon diode insulation layer is normally applied over the channel and a plurality of metallized phase electrodes 64 are spaced apart over the channel 62. Phase clocking signals $\phi 1$–$\phi 3$ are sequentially applied to the electrodes 64 in the well known manner in order to clock charge packets serially along the channel 62. Operation of such CCD shift registers is well-known and more detailed description of the construction and operation of CCD shift registers may be found in many prior publications.

In order to enable parallel loading of the shift register, a plurality of channel inlets 66 and 68 are formed at spaced apart locations along the length of the channel 62. The signals from the A row of sensors are applied to the channel inlets 68, while the signals from the B row of sensors are applied to the channel inlets 66. As may be seen, the channel inlets 66 and 68 are laterally staggered relative to one another such that the signals from the A and B sensor rows will be stored in alternate bit locations along the channel 62. Transfer electrodes 70 and 72 receive loading signals from the load counter 44, previously noted in FIG. 2, in order to control the loading of signals into the shift register. For example, if a $\phi T_1$ signal is applied to electrode 70, the signals from the B row of sensors are parallel loaded into alternate bit pockets in the channel 62. If a $\phi T_2$ signal is applied to electrode 72, signals from the A row of electrodes are parallel loaded into alternate bit pockets of the channel 62. When suitable clocking signals are applied to the electrodes 64, the stored charge packets may then be serially moved or clocked through the channel 62 to the output of the CCD shift register.

In operation of the device shown in FIGS. 1–3, it will be assumed that three image interfaces 1–3 are being moved relative to the detector array 10 shown in FIG. 2 in the direction indicated by the arrow 78. When the first image is detected by the A row of sensors, electrical signals are applied through the amplifiers 30–36 and a loading signal is applied from counter 44 to the transfer electrode of the shift register 38 in order to load the signals $A_1$–$A_4$ into alternate bit locations of shift register 38. During the next cycle of operation, image interface 2 is detected by the A row of sensors and electrical signals are applied through amplifiers 30–36, and loading signals are applied from the load counter 44 to the transfer electrode of the shift register 40, such that the signals $A_1'$–$A_4'$ are loaded into alternate storage cells of the shift register 40.

During the next clock cycle, the third image interface is sensed by the A row of sensors and electrical signals $A_1''$–$A_4''$ are applied through amplifiers 30–36 and are loaded, under the control of the load counter 44, into alternate cells of the storage register 42. Simultaneously during the third cycle of operation, the B row of sensors detects image interface 1, and electrical signals are generated through the amplifiers 46–52 to be loaded, under the control of the load counter 44, into alternate cells of the shift register 38 as signals $B_1$–$B_4$. During the next cycle of operation, image interface 2 is detected by the B row and signals are loaded under the control of the load counter 44 into shift register 40 as signals $B_1'$–$B_4'$. Similarly, in the next cycle of operation, the third image interface is detected by the B row of sensors and signals $B_1''$–$B_4''$ are loaded under the control of load counter 44 into alternate cells of the shift register 42.

After the shift registers 38–42 have been loaded in the manner described, the digital clock 56 provides clocking signals to the phase electrode 64 of the shift registers in order to serially clock the signals out from the shift registers 38 to the video adder 54 to provide a composite video signal for application to the display 20. The serial signals are sequentially unloaded from the registers 38, 40 and 42 respectively, to provide a series of signals which is representative of the signals applied from a contiguous inline array.

Figure 4:
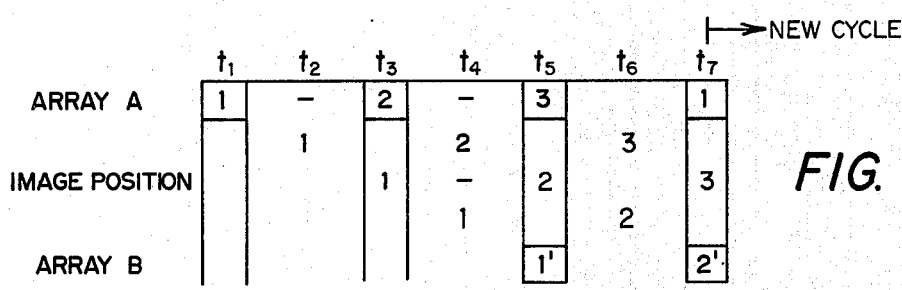
FIG. 4 is a graphical representation of the storage of three images in the system shown in FIG. 2 during a cycle of operation of the system.
Figure 5:
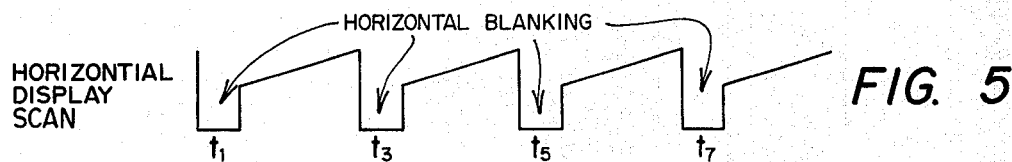
FIG. 5 is a graphical representation of the horizontal display scan signal of the system shown in FIG. 1 for controlling the operation of the display of the system.
Figure 6:
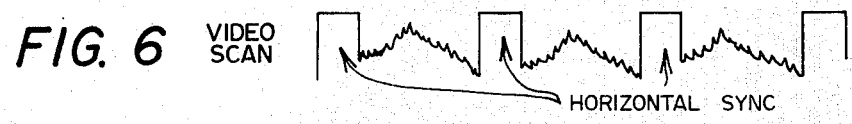
FIG. 6 is a graphical representation of the video scan signal for control of the display of the system shown in FIG. 1.

FIGS. 4–6 illustrate graphically the operation of the system shown in FIG. 2. FIG. 4 illustrates the position of the three images during the seven clocking intervals in a cycle of operation of the system. Seven timing cycles $t_1$–$t_7$ are performed by the system, with the interval $t_1$–$t_5$ comprising the image scanning and mutliplexing operation and $t_5$–$t_7$ the display scanning operation of the system. FIG. 4 illustrates the progression of the image interfaces through rows A and B and through the various shift registers shown in FIG. 2. For example, at $t_1$, image 1 is stored in the first shift register 38. During time interval $t_2$–$t_5$, the first image interface moves toward row B until the first image interface is stored in the first shift register 38 in the B stages at $t_5$. At $t_3$, the second image interface is stored in the second shift register 40 in the alternate A stages, and during the time interval $t_4$–$t_6$ the second image interface moves toward the B detectors until the second image is detected by row B and is stored in the second shift register 40 at $t_7$. Similarly, the third image interface is detected by row A and stored in the third shift register 42 at $t_5$.

FIG. 5 illustrates the horizontal display scan utilized to clock portions of the present circuit, wherein horizontal blanking intervals occur at $t_1$, $t_3$, $t_5$ and $t_7$ during which the contents of the shift registers are sampled. FIG. 6 illustrates the video scan waveform which includes horizontal sync portions at intervals $t_5$, $t_7$ and the like and video display portions during intervals $t_6$, etc. Thus, during the horizontal sync waveform occurring at $t_5$, the first shift register 38 is serially read out to provide the sequence $A_1$, $B_1$, $A_2$, $B_2$, $A_3$, $B_3$ . . . to provide a multiplexed signal. As previously noted, the multiplexed signal thus converts the parallel output from the staggered sensor array into a series output signal apparently from a contiguous inline array. The system does not require fast analog to digital conversion and, as shown in FIGS. 4–6, controls the timing in a digital manner.

Other advantages of the present invention are that the charge coupled devices are economical to fabricate and use. An important feature of the system is that shift rate reduction may be provided, if desired, by alternately shifting two or more of the shift registers into a common analog adder, or controlling the serial shifting from the shift registers in any desired manner to provide desired displays.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A multiplexing system for a detection array having staggered sensor rows comprising:
    a series of analog signal storage cells,
    means for parallel loading a first set of alternate ones of said analog signal storage cells with first analog output signals from one of said sensor rows,
    means for parallel loading a second set of said storage cells with second analog output signals from another of said sensor rows, such that said first and second analog signals are alternatively stored within said cells,
    means for serially clocking said first and second signals out from said storage cells to provide a multiplexed series of said analog signals.

2. The multiplexing system of claim 1 wherein said series of storage cells comprise a charge coupled device analog shift register.

3. The multiplexing system of claim 2 and further comprising:
    a charge coupled device channel having channel inputs spaced along the sides thereof, and
    transfer electrodes spanning said channel inputs for selectively loading said first and second analog signals in alternate ones of said analog signal storage cells.

4. The multiplexing system of claim 3 and further comprising:
    clock electrodes operable in response to clocking signals for serially clocking said signals out from said storage cells.

5. A multiplexing system for an image detection array comprising:
    first and second rows of image detectors for generating analog electrical signals representative of sensed images,
    said second row of image detectors laterally staggered relative to said first row and spaced away from said first row,
    first and second charge coupled device analog shift registers each having a plurality of channel inlets spaced along the length thereof,
    means operable during a first clock period for parallel loading analog electrical signals from said first row of detectors into a first set of alternate ones of said channel inlets of said first analog shift register for storage within alternate stages of said first shift register,
    means operable during a second clock period for parallel loading analog electrical signals from said second row of detectors into a second set of alternate ones of said channel inlets of said first analog shift register for storage in said first shift register between electrical signals from said first row of detectors,
    means operable during said second clock period for parallel loading analog electrical signals from said first row of detectors into a first set of alternate ones of said channel inlets of said second analog shift register for storage within alternate stages of said second shift register, means operable during a third clock period for parallel loading analog electrical signals from said second row of detectors into a second set of alternate ones of said channel inlets of said second analog shift register for storage in said second shift register between analog electrical signals from said first row of detectors, and means for selectively serially clocking said stored analog electrical signals from the outputs of said first and second analog shift registers for providing a composite display representative of the sensed images.

6. The multiplexing system of claim 5 wherein each of said charge coupled devices includes a channel having a plurality of channel inlets spaced along the length thereof, and transfer electrodes spanning said channel inlets and operable to parallel analog electrical signals into said first and second sets of alternate ones of said channel inlets.

7. The multiplexing system of claim 6 and further comprising:

phase electrodes spanning said channel and operable to receive clocking signals for serially clocking stored electrical signals out from said shift registers.

8. A multiplexing system for an image detection array having at least two rows of staggered image sensors, said sensors including analog signal outputs, comprising:

three charge coupled device analog shift registers each having a channel with a plurality of channel inlets spaced along the length thereof, said analog shift registers including transfer electrodes spanning said channel inlets and clock electrodes spanning said channel, first means connecting the analog signal outputs of a first row of said image sensors to a first set of alternate ones of said channel inlets, second means connecting the analog signal outputs of a second row of said image sensors to a second set of alternate ones of said channel inlets, load circuitry for generating loading signals to said transfer electrodes for sequentially parallel loading ones of said shift registers with analog electrical signals from said image sensors, clock means for generating clock signals to said clock electrodes for serially unloading said shift registers, means for adding serial analog signal outputs from said shift register, and means connected to said adding means for displaying visual representations of said serial analog signal outputs.

9. The multiplexing system of claim 8 and further including synchronization means for applying synchronizing signals to said multiplexing system and to said displaying means.

10. The multiplexing system of claim 8 wherein said shift registers are sequentially loaded with analog electrical signals from said first row of sensors and then are sequentially loaded with analog electrical signals from said second row of sensors.

11. The multiplexing system of claim 8 wherein the analog output signals from said shift registers comprise multiplexed signals representative of analog output signals from an inline contiguous image sensor array.

12. The method of multiplexing outputs from an image detection array comprising:

sequentially generating analog electrical output signals from first and second rows of physically staggered image sensors, parallel loading analog electrical signals from said first row into a first set of alternate channel inlets of a first charge coupled device analog shift register, parallel loading analog electrical signals from said second row into a second set of alternate channel inlets of the first analog register while parallel loading analog electrical signals from said first row into a first set of alternate channel inlets of a second charge coupled device analog shift register, parallel loading analog electrical signals from said second row into a second set of alternate channel inlets of the second register, serially clocking the stored analog electrical signals from the outputs of said first and second registers, and displaying a composite display of the analog electrical signals.

* * * * *